(12) United States Patent
Debe et al.

(10) Patent No.: US 6,770,337 B2
(45) Date of Patent: Aug. 3, 2004

(54) THERMAL TRANSFER OF MICROSTRUCTURED LAYERS

(75) Inventors: Mark K. Debe, Stillwater, MN (US); Martin B. Wolk, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/356,047

(22) Filed: Jan. 31, 2003

(65) Prior Publication Data

US 2003/0138555 A1 Jul. 24, 2003

Related U.S. Application Data

(62) Division of application No. 09/451,984, filed on Nov. 30, 1999, now Pat. No. 6,521,324.

(51) Int. Cl.[7] .............................................. B41M 5/30
(52) U.S. Cl. .................. 428/32.6; 428/32.8; 428/32.81; 427/146; 427/152; 156/235
(58) Field of Search ..................... 156/235; 427/146, 427/152; 428/32.6, 32.8, 32.81

(56) References Cited

U.S. PATENT DOCUMENTS

| | | | |
|---|---|---|---|
| 3,969,545 | A | 7/1976 | Slocum |
| 4,148,294 | A | 4/1979 | Scherber et al. |
| 4,155,781 | A | 5/1979 | Diepers |

(List continued on next page.)

FOREIGN PATENT DOCUMENTS

| | | |
|---|---|---|
| EP | 321 923 | 7/1992 |
| EP | 568 993 | 8/1998 |
| WO | WO 94/14619 | 7/1994 |

OTHER PUBLICATIONS

Chow, G. M., Stockton, W. B., Price, R., Baral, S., Ting, A. C., Ratna, B. R., Shoeln, P. E., and Schnur; J. M.; Bergeron, G. L., Czarnaski, M. A., Hickman, J. J., and Kirkpatrick, D. A.; "Fabrication of Biologically Based Microstructure Composites for Vacuum Field Emission," *Materials Science and Engineering*, A158 (1992), pp. 1–6.

Kam, K. K., Debe, M. K., Poirier, R. J., and Drube, A. R., "Summary Abstract: Dramatic Variation of the Physical Microstructure of a Vapor Deposited Organic Thin Film," *J. Vac. Sci. Technol.* A, 5, (4), Jul./Aug., 1987, pp. 1914–1916.

Debe, M. K., Kam, K. K., Liu, J. C., and Poirier, R. J., "Vacuum Vapor Deposited Thin Films of a Perylene Dicarboximide Derivative: Microstructure Versus Deposition Parameters," *J. Vac. Sci. Technol.* A6, (3), May/Aug., 1988, pp. 1907–1911.

Debe, M. K., and Poirier, R. J., "Effect of Gravity on Copper Phthalocyanine Thin Films III: Microstructure Comparisons of Copper Phthalocyanine Thin Films Grown in Microgravity and Unit Gravity," *Thin Solid Films.*, 186, 1990, pp. 327–347.

Sadaoka, Y., Jones, T. A., G. S. Revell, and Gopel, W., "Effects of Morphology or $NO_2$ Detection in Air at Room Temperature with Phthalocyanine Thin Films," *J. Mat. Sci.*, 25, 1990, pp. 5257–5268.

(List continued on next page.)

*Primary Examiner*—B. Hamilton Hess

(57) ABSTRACT

Articles having a component with a surface defining microstructured features can be formed using thermal transfer elements. One example of a suitable thermal transfer element includes a microstructured layer having a surface defining microstructured features imposed on the microstructured layer. The thermal transfer element is configured and arranged for the transfer of at least a portion of the microstructured layer to a receptor while substantially preserving the microstructured features of that portion.

32 Claims, 7 Drawing Sheets

U.S. PATENT DOCUMENTS

| | | |
|---|---|---|
| 4,209,008 A | 6/1980 | Lemkey et al. |
| 4,252,671 A | 2/1981 | Smith |
| 4,252,843 A | 2/1981 | Dorer et al. |
| 4,252,865 A | 2/1981 | Gilbert et al. |
| 4,340,276 A | 7/1982 | Maffitt et al. |
| 4,396,643 A | 8/1983 | Kuehn et al. |
| 4,568,598 A | 2/1986 | Bilkadi et al. |
| 4,722,583 A | 2/1988 | Stewart |
| 4,812,352 A | 3/1989 | Debe |
| 4,833,124 A | 5/1989 | Lum |
| 4,842,893 A | 6/1989 | Yializis et al. |
| 4,912,083 A | 3/1990 | Chapman et al. |
| 4,940,640 A | 7/1990 | MacDiarmid |
| 4,942,141 A | 7/1990 | DeBoer et al. |
| 4,948,776 A | 8/1990 | Evans et al. |
| 4,948,778 A | 8/1990 | DeBoer |
| 4,950,639 A | 8/1990 | DeBoer et al. |
| 4,952,552 A | 8/1990 | Chapman et al. |
| 4,954,371 A | 9/1990 | Yializis |
| 5,023,229 A | 6/1991 | Evans et al. |
| 5,024,990 A | 6/1991 | Chapman et al. |
| 5,039,561 A | 8/1991 | Debe |
| 5,089,372 A | 2/1992 | Kirihata et al. |
| 5,097,800 A | 3/1992 | Shaw et al. |
| 5,138,220 A | 8/1992 | Kirkpatrick |
| 5,156,938 A | 10/1992 | Foley et al. |
| 5,166,024 A | 11/1992 | Bugner et al. |
| 5,171,650 A | 12/1992 | Ellis et al. |
| 5,238,729 A | 8/1993 | Debe |
| 5,256,506 A | 10/1993 | Ellis et al. |
| 5,278,023 A | 1/1994 | Bills et al. |
| 5,286,604 A | 2/1994 | Simmons, III |
| 5,308,737 A | 5/1994 | Bills et al. |
| 5,336,558 A | 8/1994 | Debe |
| 5,338,430 A | 8/1994 | Parsonage et al. |
| 5,340,699 A | 8/1994 | Haley et al. |
| 5,351,617 A | 10/1994 | Williams et al. |
| 5,360,694 A | 11/1994 | Thien et al. |
| 5,395,644 A | 3/1995 | Affinito |
| 5,401,607 A | 3/1995 | Takiff et al. |
| 5,521,035 A | 5/1996 | Wolk et al. |
| 5,685,939 A | 11/1997 | Wolk et al. |
| 5,693,446 A | 12/1997 | Staral et al. |
| 5,709,943 A | 1/1998 | Coleman et al. |
| 5,710,097 A | 1/1998 | Staral et al. |
| 5,725,989 A | 3/1998 | Chang et al. |
| 5,726,524 A | 3/1998 | Debe |
| 5,747,217 A | 5/1998 | Zaklika et al. |
| 6,172,810 B1 | 1/2001 | Fleming et al. |
| 6,503,564 B1 | 1/2003 | Fleming et al. |
| 6,521,324 B1 | 2/2003 | Debe et al. |

OTHER PUBLICATIONS

Ohnuma, Shigehiro, et al., "Amorphous Ultrafine Metallic Particles Prepared by Sputtering Method," Steeb, S., et al., Rapidly Quenched Metals, Proc. of the Fifth Int. Conf. on Rapidly Quenched Metals, Wurzburg, Germany (Sep. 3–7, 1984), eds., Elsevier Science Publishers B.V., New York, (1985), pp. 1117–1124.

Lee, P.K., and Debe, M.K., "Measurement and Modeling of the Reflectance–Reducing Properties of Gradient Index Microstructured Surfaces," Photo. Sci. and Eng., 24, (4), Jul./Aug., 1980, pp. 211–216.

Floro, J.A., et al., "Ion–Bombardment–Induced Whisker Formation on Graphite," J. Vac. Sci. Tech. A, 1, (3), Jul./Sep., 1983, pp. 1398–1402.

Bello, K.A., Corns, S. N., and Griffiths, J., "Near–Infrared–Absorbing Squaraine Dyes Containing 2,3–Dihydroperimidine Terminal Groups," *J. Chem. Soc., Chem. Commun.*, 452–454 (1993).

Grulke, Eric A., "Solubility Parameter Values," *Polymer Handbook*, Brandrup, J. and Immergut, E.H., eds., pp. VII 519–557 John Wiley & Sons (1989).

THERMAL TRANSFER OF MICROSTRUCTURED LAYERS

CROSS REFERENCE TO RELATED APPLICATIONS

This application is a divisional of U.S. application Ser. No. 09/451,984, filed Nov. 30, 1999 now U.S. Pat. No. 6,521,324, now allowed, the disclosure of which is herein incorporated by reference.

FIELD OF THE INVENTION

This invention relates to methods and transfer elements for thermal transfer of layers, as well as the devices formed thereby. In particular, the invention relates to thermal transfer elements and methods for the thermal transfer of microstructured layers, as well as the devices formed thereby.

BACKGROUND OF THE INVENTION

There is a general trend to reduce the size of many articles and devices used in industrial and consumer applications, particularly in electronics. In addition, a variety of articles and devices utilize modified surfaces. These articles and devices often require microstructured (and, in some instances, nanostructured) surfaces, layers, or components. For example, field emission devices used for articles, such as flat panel displays, can be formed using nanostructured elements (e.g., fibers, whiskers, or rods), as disclosed in U.S. Pat. No. 5,726,524, incorporated herein by reference. Nanostructured elements can also be used in, for example, catalyst systems, chemical sensors, and bioabsorption substrates. Microstructured surfaces and layers can be useful in, for example, electroluminescence devices, field emission cathodes for display devices, fluid control films having capillary channels, bioanalytical and biomolecular processing devices, and patterned electronic components and circuits.

In at least some instances, it is inconvenient, economically unfeasible, or difficult to form these microstructured and nanostructured elements, layers, surfaces, and components on a desired substrate. For example, the nanostructured elements of a field emission device may be difficult to form in a desired pattern on a substrate. Known techniques for patterning small features on substrates include, for example, ablation or adhesive lift-off techniques to remove a portion of a previously formed layer of microstructured or nanostructured elements. However, these methods may require multiple steps and may produce excessive waste materials.

SUMMARY OF THE INVENTION

Generally, the present invention relates to the formation of articles having a layer with a surface defining microstructured features, as well as thermal transfer elements and methods for making the articles. One embodiment is a thermal transfer element including a microstructured layer having a surface defining microstructured features imposed on the microstructured layer. The thermal transfer element is configured and arranged for the transfer of at least a portion of the microstructured layer to a receptor while substantially preserving the microstructured features of that portion. The thermal transfer element can include one or more additional layers such as, for example, a light-to-heat conversion layer, an interlayer, a release layer, and an adhesion layer.

Another embodiment is a method of making an article. A receptor substrate of the article is contacted with a thermal transfer element having a microstructured layer including a surface defining microstructured features imposed on the microstructured layer. At least a portion of the microstructured layer is then selectively transferred to the receptor substrate while substantially preserving the microstructured features of that portion. The transfer can be performed by selectively applying a heating element or by selectively illuminating an optional light-to-heat conversion layer of the thermal transfer element.

Yet another embodiment is an article having a substrate and a microstructured component having a surface defining microstructured features. The microstructured component is formed on the substrate by thermal transfer of at least a portion of a microstructured layer from a thermal transfer element.

A further embodiment is a method of making a thermal transfer element. A microstructured layer is formed on a substrate, optionally over a light-to-heat conversion layer, and with a surface defining microstructured features imposed on the microstructured layer. The microstructured features can be imposed on the microstructured layer by forming the layer on a substrate containing microstructured features or by modifying the surface of the layer after the layer has been formed. The microstructured layer forms at least a portion of the transfer unit of the thermal transfer element.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
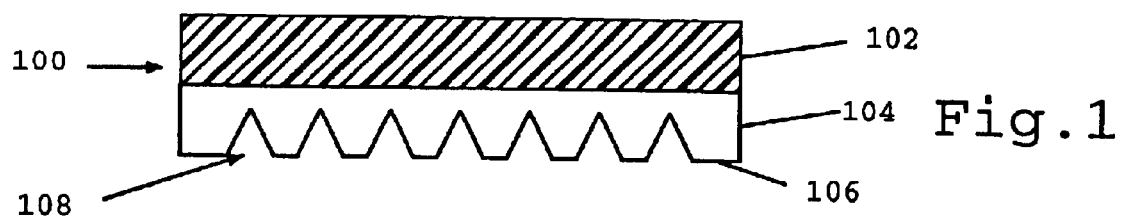
FIG. 1 is a cross-sectional view of one embodiment of a thermal transfer element containing a microstructured layer, according to the invention (in this and the following figures, some cross-hatching has been omitted for clarity of illustration)

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENT

The present invention is believed to be applicable to the formation of articles having a layer including a surface defining microstructured features, as well as thermal transfer elements and methods for making the articles. In particular, the present invention is directed to articles formed by thermal transfer of a microstructured layer having a surface defining microstructured features, as well as the thermal transfer elements and methods for making the articles. While the present invention is not so limited, an appreciation of various aspects of the invention will be gained through a discussion of the examples provided below.

The term "microstructured features" refers to features of a surface that have at least one dimension (e.g., height, length, width, or diameter) of less than one millimeter. The microstructured features are purposely imposed on a microstructured layer and do not include inadvertent formations, such as, for example, scratches, dents, and imperfections in the materials of the microstructured layer. Imposition of the microstructured features on the microstructured layer includes, but is not limited to, forming the microstructured features by a) modifying a surface of an existing layer to form the microstructured features and b) depositing a layer onto a surface already having microstructured features. Microstructured features can be formed, according to the invention, which have at least one dimension of no more than 100 micrometers or 10 micrometers.

The term "microstructured layer" refers to a layer having a surface that defines microstructured features.

The term "microstructured element" refers to an individual microstructured feature of a surface and includes features that extend away from adjacent portions of the surface.

The term "nanostructured features" refers to features of a surface that have at least one dimension (e.g., height, length, width, or diameter) of less than one micrometer. Nanostructured features are included within the definition of the term "microstructured features."

The term "nanostructured layer" refers to a layer having a surface that defines nanostructured features. Nanostructured layers are included within the definition of the term "microstructured layer."

The term "nanostructured element" refers to an individual nanostructured feature of a surface and includes features that extend away from adjacent portions of the surface.

The thermal transfer element typically contains at least a donor substrate and a transfer unit that includes at least one microstructured layer. In operation, a portion of the transfer unit, including a portion of the microstructured layer, is transferred from the thermal transfer element and the donor substrate to a receptor. FIG. 1 illustrates a thermal transfer element 100 with a donor substrate 102 and a microstructured layer 104 having a surface 106 defining microstructured features 108. Other layers that can be included in the thermal transfer element include, for example, a light-to-heat conversion (LTHC) layer, an interlayer, a release layer, and an adhesion layer. Each of these layers is discussed in detail below. Any of these layers can be deposited using a variety of techniques. The selection of an appropriate technique will depend, at least in part, on the nature of the materials used for the layers. Suitable techniques for forming the layers include, for example, chemical and physical vapor deposition, sputtering, spin coating, roll coating, and other film coating methods.

Donor Substrate and Optional Primer Layer

The donor substrate provides a support for the layers of the thermal transfer element. The donor substrate for the thermal transfer element can be a polymer film. One suitable type of polymer film is a polyester film, for example, polyethylene terephthalate or polyethylene naphthalate films. However, other films with sufficient optical properties (if light is used for heating and transfer), including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of any layers in the thermal transfer element (e.g., a light-to-heat conversion (LTHC) layer). A suitable thickness for the donor substrate ranges from, for example, 0.025 to 0.15 mm, preferably 0.05 to 0.1 mm, although thicker or thinner donor substrates may be used, if desired.

The materials used to form the donor substrate and the other thermal transfer element layers, particularly, the LTHC layer can be selected to improve adhesion between the layers and the donor substrate. An optional priming layer can be used to increase uniformity during the coating of subsequent layers and also increase the interlayer bonding strength between the other layers of the thermal transfer element and the donor substrate. One example of a suitable substrate with primer layer is available from Teijin Ltd. (Product No. HPE100, Osaka, Japan).

Transfer Unit and Microstructured Layer(s)

The thermal transfer element includes a transfer unit which has one or more layers, portions of which are to be transferred to a receptor. The transfer unit includes at least one microstructured layer. In addition, the transfer unit can include other layers to be transferred.

Microstructured Layers

The microstructured layer has at least one surface that defines microstructured features. In some embodiments, this microstructured layer includes a surface that defines nanostructured features and can, therefore, be referred to as a "nanostructured layer." Thermal transfer of a portion of the thermal transfer unit entails transferring, according to a desired pattern, a portion of the thermal transfer unit onto a receptor. This includes transferring a portion of the microstructured layer onto the receptor while, preferably, substantially preserving the microstructured features of the transferred portion of the microstructured layer.

The thermal transfer elements can be used to form a variety of articles and devices including, for example, patterned electrical circuits and components, microelectrodes, electroluminescence devices, field emission cathodes, semiconductor devices, optical devices, and microelectrical mechanical devices. One particular use of the thermal transfer element is the formation of microstructured or, preferably, nanostructured elements (e.g., whiskers, fibers, cones, pyramids, or rods) that can be used in, for example, field emission displays, chemical and biological sensors, catalyst substrates, and bioabsorption substrates.

Figure 7A:
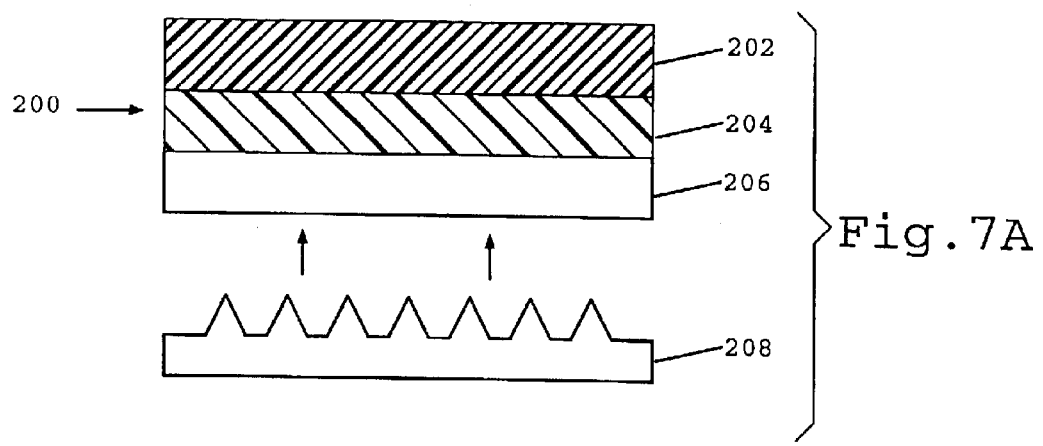
FIGS. 7A and 7B illustrate, in cross-sectional view, one method of forming a thermal transfer element, according to the invention.
Figure 7B:
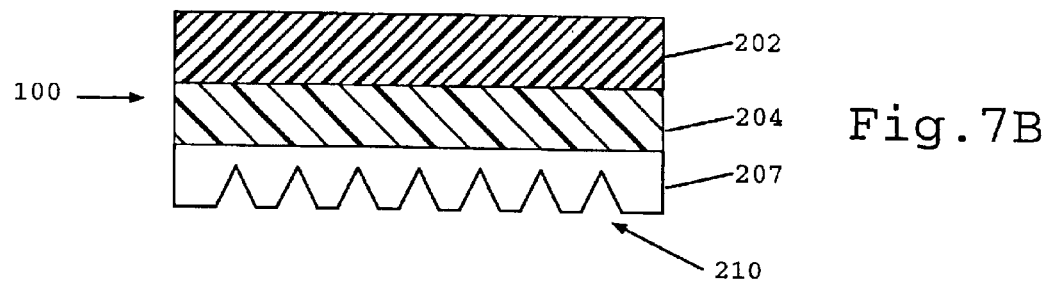

The microstructured features of the microstructured layer can be formed using a variety of techniques including, for example, laser patterning, photolithography, machining, embossing, printing, and injection or other molding techniques. Patterns can be made in a single material or the microstructured layer can be patterned using two or more different materials (e.g., stripes of different materials). FIGS. 7A and 7B illustrate one particular technique for forming a microstructured layer. In this technique, a thermal transfer element 200 is provided that includes a donor substrate 202, light-to-heat conversion layer 204, and an unstructured layer 206, as illustrated in FIG. 7A, although other combinations of layers could be used. The unstructured layer 206 is formed of a material that can be patterned, molded, embossed, or otherwise modified to impose microstructured features on the unstructured layer. For example, the unstructured layer 206 can be a thermoplastic or thermoset material.

A microstructured tool 208 is used to impose the microstructured features on the unstructured layer 206. The microstructured tool 208 can be used to emboss, mold, imprint, stamp, indent, or otherwise impose the microstructured features 210 on the unstructured layer to generate a microstructured layer 207, as illustrated in FIG. 7B. The unstructured layer 206 is optionally heated or otherwise treated to facilitate the formation of the microstructured features. In some embodiments, the microstructured layer is formed of a curable material that is then cured after formation of the microstructured features to hold the features.

Figure 5:
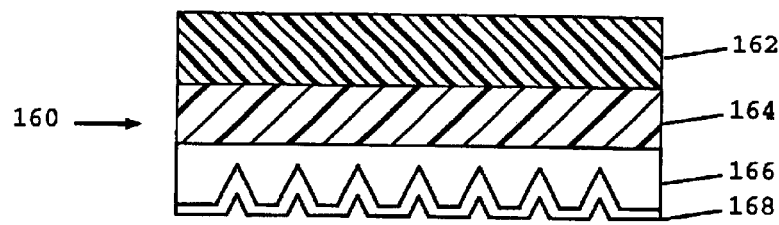
FIG. 5 is a cross-sectional view of a fifth embodiment of a thermal transfer element containing a microstructured layer, according to the invention.

In another method of making a microstructured layer, a second microstructured layer 168 is formed over the first microstructured layer 166, as illustrated in FIG. 5, thereby imposing the microstructured features of the first microstructured layer on the second microstructured layer. Thermal transfer element 160, as illustrated, also includes a donor substrate 162 and a light-to-heat conversion layer 164, however, other combinations of layers can be used. The second microstructured layer 168 can be formed using a variety of materials, including polymers and metals, and by a variety methods, including chemical vapor deposition, physical vapor deposition, sputtering, coating, electroplating, and electroless plating. Another example of a method for forming a microstructured layer is monomer vapor deposition to generate polymers by in situ polymerization of vapor deposited monomers, as described in, for example, U.S. patent applications Ser. Nos. 09/259,487 and 09/259,100 and U.S. Pat. Nos. 5,395,644; 5,097,800; 4,954,371; and 4,842,893, all of which are incorporated herein by reference. The second microstructured layer 168 can be a conformal layer as illustrated in FIG. 5, or the second microstructured layer 168 may fill the microstructured features of the first microstructured layer 166 and have a smooth or rough surface opposite the microstructured features.

In some instances, the second microstructured layer 168 is the primary layer of the transfer unit. The first microstructured layer 166 can act as the mold, framework, model, or template for the features of the second microstructured layer 168. As an example, a portion of the second microstructured layer 168 can be transferred with the associated portion of the first microstructured layer 166 acting as a release layer. This associated portion of the first microstructured layer 166 can be transferred or, in some embodiments, not transferred with the portion of the second microstructured layer 168. Even if the associated portion of the first microstructured layer 166 is transferred, that portion could be removed, if desired, by, for example, heating to sublimate, vaporize, liquefy, decompose, or depolymerize the transferred portion of the first microstructured layer 166.

Figure 8:
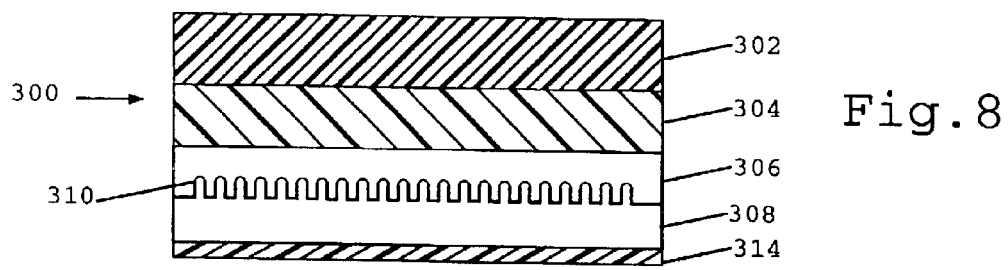
FIG. 8 is a cross-sectional view of a seventh embodiment of a thermal transfer element containing a microstructured layer, according to the invention.
Figure 9A:
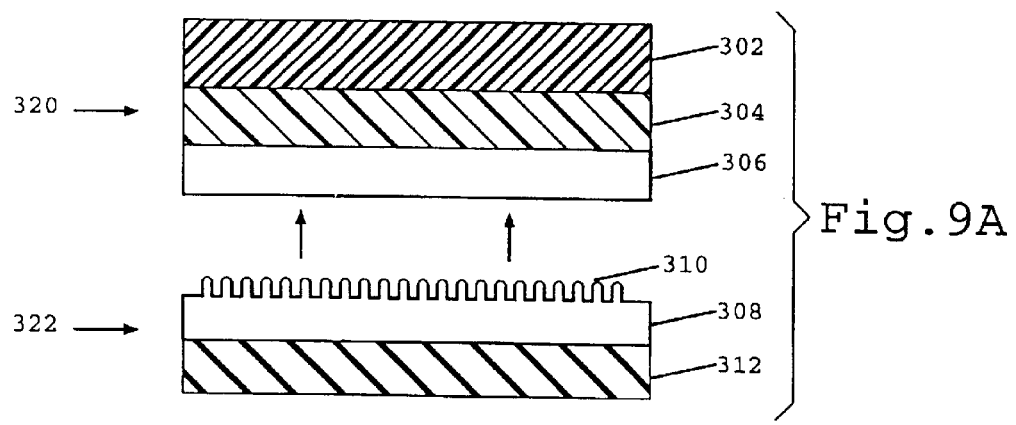
FIGS. 9A to 9C illustrate, in cross-sectional view, another method of forming the thermal transfer element, according to the invention.
Figure 9B:
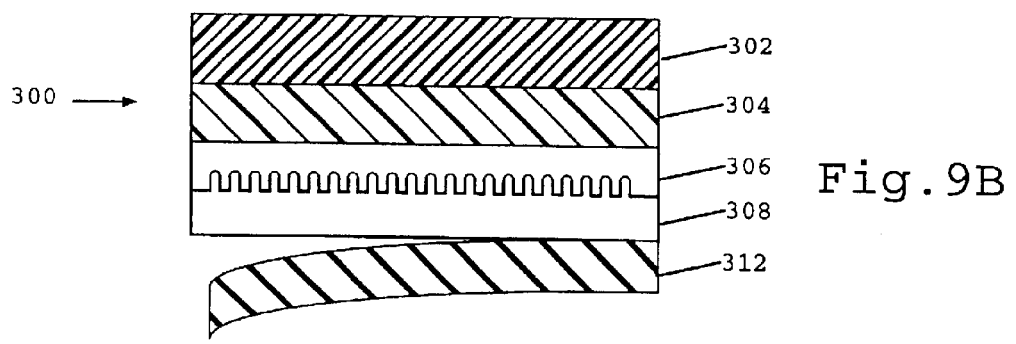
Figure 9C:
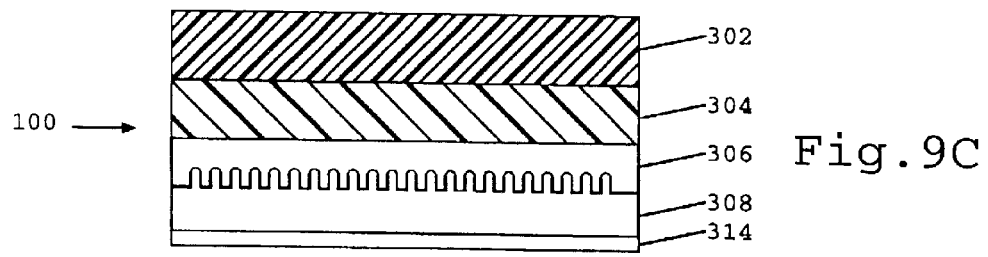

FIGS. 9A to 9C illustrate another technique for forming a thermal transfer element 300, as illustrated in FIG. 8. The thermal transfer element 300 of FIG. 8 includes a donor substrate 302, a light-to-heat conversion layer 304, a release layer 306, microstructured layer 308 having a surface with microstructured features 310, and an adhesion layer 314. It will be understood that other thermal transfer elements could be formed using other combinations of layers (for example, a thermal transfer element without an adhesion layer or light-to-heat conversion layer).

Initially, a film 320 having the donor substrate 302, the light-to-heat conversion layer 304, and the releaser layer 306 is provided, as illustrated in FIG. 9A. A microstructured film 322 including the microstructured layer 308 having a surface with microstructured features 310 and an optional release liner 312 is provided separately.

The release layer 306 is typically formed using a material, such as a thermoplastic or thermoset polymer, into which the microstructured features 310 of the microstructured layer 308 can be pressed, pushed, implanted, inserted, or otherwise embedded, as illustrated in FIG. 9B. The microstructured features 310 of the microstructured layer 308 are embedded into the release layer 306 by a variety of techniques including, for example, manually or mechanically pressing the microstructured layer into the release layer. After embedding the microstructured features 310 into the release layer 306, the release liner 312 is removed. Optionally, an adhesion layer 314 can be formed over the microstructured layer 308, as illustrated in FIG. 9C and described below.

This technique can be modified in a variety of ways. For example, the microstructured features can be embedded in a layer other than a release layer. This layer could have another function in the thermal transfer element or the layer could be useful solely as a layer for embedding the microstructured features. In addition, the thermal transfer unit could be modified to include any of the additional layers described below and/or to exclude the light-to-heat conversion layer, release layer, and/or adhesion layer.

EXAMPLES OF NANOSTRUCTURED ELEMENTS

Suitable microstructured features that could be used in the technique illustrated in FIGS. 9A to 9C are microstructured or nanostructured elements such as those described in U.S. Pat. Nos. 4,812,352; 5,039,561; 5,336,558; 5,709,943; 5,338,430; 5,238,729; and 5,726,524, incorporated herein by reference. These nanostructured elements are formed by depositing a vapor of an organic material as a thin continuous or discontinuous layer onto a substrate and then annealing the deposited organic layer in a vacuum for a time and a temperature sufficient to induce a physical change in the deposited organic layer to form the nanostructured elements.

Suitable organic materials include, for example, thermoplastic polymers, such as alkyd, melamine, urea formaldehyde, diallyl phthalate, epoxide, phenolic, polyester, and silicone polymers; thermoset polymers, such as acrylonitrile-butadiene-styrene, acetal, acrylic, cellulosic, ethylene-vinyl acetate, fluorocarbon, nylon parylene, phenoxide, polyallomer, polypropylene, polyamideimide, polyimide, polycarbonate, polyester, polyphenylene oxide, polystyrene, polysulfone, and vinyl polymers; and organo-metallic compounds, such as bis($\eta^5$-cyclopentadienyl)iron (II), iron pentacarbonyl, ruthenium pentacarbonyl, osmium pentacarbonyl, chromium hexacarbonyl, molybdenum hexacarbonyl, tungsten hexacarbonyl, and tris (triphenylphosphine) rhodium chloride. Other useful organic materials are those that crystallize in a herringbone configuration and include polynuclear aromatic hydrocarbons and heterocyclic aromatic compounds. Suitable preferred organic materials include naphthalenes, phenanthrenes, perylenes, anthracenes, coronenes, pyrenes, phthalocyanines, porphyrins, carbazoles, purines, and pterins. One preferred organic material is N,N'-di(3,5-xylyl) perylene-3,4,9,10 bis(dicarboxamide) (commercially available under the trade designation "C.I. Pigment Red 149" from American Hoechst Corp., Somerset, N.J.) and known as "perylene red."

Preferably, the nanostructured elements are of uniform length and shape, and have uniform cross-sectional dimensions along their major axes. As an example, nanostructured elements can be formed having a length of about 50 micrometers or less. In some instances, the length of each nanostructured element is in the range from about 0.1 to 5 micrometers and can be in the range of 0.1 to 3 micrometers. Nanostructured elements with an average cross-sectional dimension of about 1 micrometer or less can be formed. In some instances, the cross-sectional dimension is in the range of 0.01 to 0.5 micrometers and can be in the range of 0.03 to 0.3 micrometers.

Nanostructured elements can be formed by this method having an areal number density in the range from about $10^7$ to about $10^{11}$ microstructures per square centimeter. In some embodiments, the nanostructured elements have an areal density in the range from about $10^8$ to about $10^{10}$ microstructures per square centimeter. Each individual nanostructured element can be monocrystalline or polycrystalline, rather than amorphous. The microstructured layer can have highly anisotropic properties due to the crystalline nature and uniform orientation of the microstructures.

Nanostructured elements can have a variety of orientations and straight and curved shapes, (e.g., whiskers, rods, cones, pyramids, spheres, cylinders, and the like that can be twisted, curved, or straight), and any one layer can include a combination of orientations and shapes. Orientation of the nanostructured elements can be affected by the substrate temperature, the deposition rate, and angle of incidence during deposition of the organic layer. If the temperature of the substrate during deposition of the organic material is sufficiently high (i.e., above a critical substrate temperature which has been associated in the art with a value one-third the boiling point (° K) of the organic material), the deposited organic material will form randomly oriented nanostructured elements either as deposited or when subsequently annealed. If the temperature of the substrate during deposition is relatively low (i.e., below the critical substrate temperature), the deposited organic material tends to form uniformly oriented nanostructured elements when annealed. For example, if uniformly oriented nanostructured elements containing perylene red are desired, the temperature of the substrate during the deposition of the perylene red is preferably about 0° C. to about 30° C. Certain subsequent conformal coating processes, such as DC magnetron sputtering and cathodic arc vacuum processes, produce curvilinear microstructures.

In the annealing step, the substrate having an organic layer coated thereon is heated in a vacuum for a time and at a temperature sufficient for the coated organic layer to undergo a physical change, where the organic layer grows to form a microstructured layer having a dense array of discrete, oriented monocrystalline or polycrystalline nanostructured elements. Uniform orientation of the nanostructured elements is a typical consequence of the annealing process when the substrate temperature during deposition is sufficiently low. Exposure of the coated substrate to the atmosphere prior to the annealing step is not observed to be detrimental to subsequent microstructure formation.

If, for example, the coated organic material is perylene red or copper phthalocyanine, annealing is preferably done in a vacuum (i.e., less than about $1\times10^{-3}$ Torr) at a temperature in the range from about 160° C. to about 270° C. The annealing time necessary to convert the original organic layer to the microstructured layer is dependent on the annealing temperature. Typically, an annealing time in the range from about 10 minutes to about 6 hours is sufficient. Preferably the annealing time is in the range from about 20 minutes to about 4 hours. Further, for perylene red, the optimum annealing temperature to convert all of the original organic layer to a microstructured layer, but not sublime it away, is observed to vary with the deposited layer thickness. Typically, for original organic layer thicknesses of 0.05 to 0.15 micrometer, the temperature is in the range of 245° C. to 270° C.

Other methods for making microstructured layers are known in the art. For example, methods for making organic microstructured layers are disclosed in Materials Science and Engineering, A158 (1992), pp. 1–6; J. Vac. Sci. Technol. A, 5, (4), July/August, 1987, pp. 1914–16; J. Vac. Sci. Technol. A 6, (3), May/August, 1988, pp. 1907–11; Thin Solid Films., 186, 1990, pp. 327–47; J. Mat. Sci., 25, 1990, pp. 5257–68; Rapidly Quenched Metals, Proc. of the Fifth Int. Conf. on Rapidly Quenched Metals, Wurzburg, Germany (Sep. 3–7, 1984), S. Steeb et at., eds., Elsevier Science Publishers B. V., New York, (1985), pp. 1117–24; Photo. Sci. and Eng., 24, (4), July/August, 1980, pp. 211–16; and U.S. Pat. Nos. 4,568,598 and 4,340,276, the disclosures of which patents are incorporated herein by reference. Methods for making inorganic-based microstructured layers of whiskers are disclosed, for example, in J. Vac. Sci. Tech. A, 1, (3), July/September, 1983, pp. 1398–1402 and U.S. Pat. Nos. 3,969,545; 4,252,865, 4,396,643, 4,148,294, 4,252,843, 4,155,781, 4,209,008, and 5,138,220, the disclosures of which patents are incorporated herein by reference.

Useful inorganic materials for producing nanostructured elements include, for example, carbon, diamond-like carbon, ceramics (e.g., metal or non-metal oxides such as alumina, silica, iron oxide, and copper oxide; metal or non-metal nitrides such as silicon nitride and titanium nitride; and metal or non-metal carbides such as silicon carbide; metal or non-metal borides such as titanium boride); metal or non-metal sulfides such as cadmium sulfide and zinc sulfide; metal silicides such as magnesium silicide, calcium silicide, and iron silicide; metals (e.g., noble metals such as gold, silver, platinum, osmium, iridium, palladium, ruthenium, rhodium, and combinations thereof, transition metals such as scandium, vanadium, chromium, manganese, cobalt, nickel, copper, zirconium, and combinations thereof; low melting metals such as bismuth, lead, indium, antimony, tin, zinc, and aluminum; refractory metals such as tungsten, rhenium, tantalum, molybdenum, and combinations thereof); and semiconductor materials (e.g., diamond, germanium, selenium, arsenic, silicon, tellurium, gallium arsenide, gallium antimonide, gallium phosphide, aluminum antimonide, indium antimonide, indium tin oxide, zinc antimonide, indium phosphide, aluminum gallium arsenide, zinc telluride, and combinations thereof).

In some embodiments, the nanostructured elements (e.g., whiskers or fibers) are coated with one or more layers of conformal coating material. The conformal coating material, if applied, can serve as a functional layer imparting desirable electronic properties such as conductivity and electronic work function, as well as other properties such as thermal properties, optical properties, for example, light absorbing for ablation, mechanical properties (e.g., strengthens the microstructures comprising the microstructured layer), chemical properties (e.g., provides a protective layer), and low vapor pressure properties. The conformal coating material can be an inorganic material, organic material, or polymeric material. Useful inorganic and organic conformal coating materials include, for example, those described above in the description of the microstructures. Useful organic materials also include, for example, conductive polymers (e.g., polyacetylene), polymers derived from poly-p-xylylene, and materials capable of forming self-assembled layers. As an example, the thickness of a suitable conformal coating can be in the range from about 0.2 to about 50 nm.

The conformal coating may be deposited onto the microstructured layer using conventional techniques, including, for example, those disclosed in U.S. Pat. Nos. 4,812,352 and 5,039,561, the disclosures of which are incorporated herein by reference. Typically, any method that avoids disturbance of the microstructured layer by mechanical forces can be used to deposit the conformal coating. Suitable methods include, for example, vapor phase deposition (e.g., vacuum evaporation, sputter coating, chemical vapor deposition, and monomer vapor deposition) solution coating or dispersion coating (e.g., dip coating, spray coating, spin coating, pour coating (i.e., pouring a liquid over a surface and allowing the liquid to flow over the microstructured layer, followed by solvent removal)), immersion coating (i.e., immersing the microstructured layer in a solution for a time sufficient to allow the layer to adsorb molecules from the solution, or colloidals or other particles from a dispersion), electroplating and electroless plating. Preferably, the conformal coating is deposited by vapor phase deposition methods, such as, for example, ion sputter deposition, cathodic arc deposition, vapor condensation, vacuum sublimation, physical vapor transport, chemical vapor transport, and metalorganic chemical vapor deposition.

Multiple Microstructures

Figure 12:
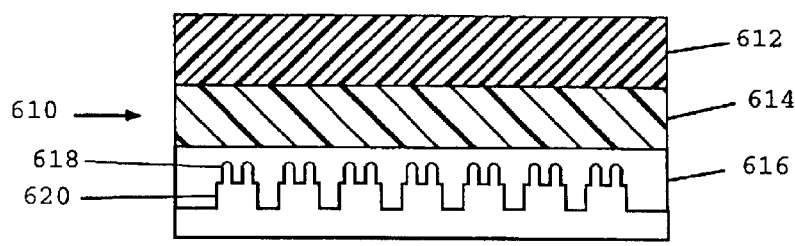
FIG. 12 is a cross-sectional view of an eighth embodiment of a thermal transfer element, according to the invention.

FIG. 12 illustrates yet another embodiment of a thermal transfer element 610. The thermal transfer element includes a donor substrate 612, a light-to-heat conversion layer 614, and a microstructured layer 616. The microstructured layer 616 has a surface that defines a first set of microstructured features 618 and a second set of microstructured features 620. Additional layers and layer configurations can be used, as well as additional sets of microstructured features.

The second set of microstructured features 620 can be formed on or over the first set of microstructure features 618. Alternatively, the first and second sets of microstructured features can be formed so that they have no overlap or only partial overlap. The first and second sets of microstructured features (and any additional sets of microstructured features) can be used to form structures, when transferred, that are a combination of the features. For example, the microstructured features illustrated in FIGS. 9A to 9C could be further patterned using a second set of microstructured features.

Multi-Microstructured Layer Transfer Units

Figure 13:
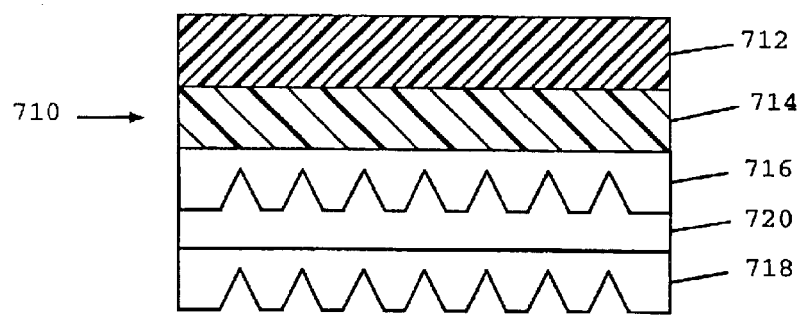
FIG. 13 is a cross-sectional view of a ninth embodiment of a thermal transfer element, according to the invention.

FIG. 13 illustrates another other embodiment of a thermal transfer element 710. This thermal transfer element includes a donor substrate 712, a light-to-heat conversion layer 714, and a transfer unit containing at least two microstructured layers 716, 718. Additional layers or other layer configurations can be used, as described herein.

The microstructured features of the two (or more) microstructured layers 716, 718 can be the same, as shown in FIG. 13. Alternatively, the microstructured features of each layer can be different. As yet another alternative, the microstructured layers can be separated by an intervening layer 720. In some embodiments, the two or more microstructured layers and any intervening layers, as well as other layers of the thermal transfer unit, can be used to form part of or all of a multilayer device (e.g., a multilayer electronic or optical device, such as an organic electroluminescent device or a transistor).

Light-to-Heat Conversion (LTHC) Layer

Figure 2:
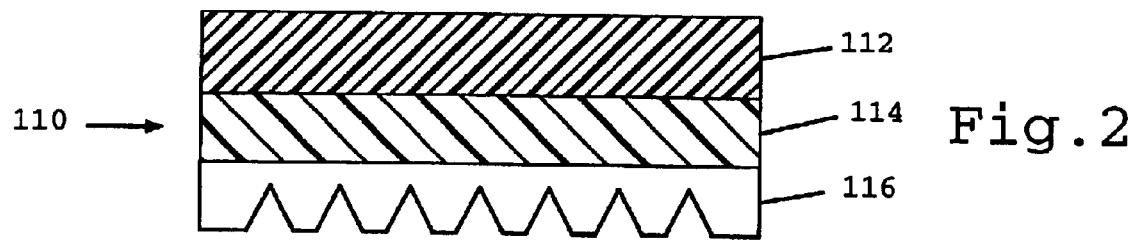
FIG. 2 is a cross-sectional view of a second embodiment of a thermal transfer element containing a microstructured layer, according to the invention.

For radiation-induced thermal transfer, a light-to-heat conversion (LTHC) layer is typically incorporated within the thermal transfer element to couple the energy of light radiated from a light-emitting source into the thermal transfer element. FIG. 2 illustrates one embodiment of a thermal transfer element 110 including a donor substrate 112, a light-to-heat conversion layer 114, and a microstructured layer 116. Other thermal transfer element structures containing an LTHC layer can be formed.

The LTHC layer typically includes a radiation absorber that absorbs incident radiation (e.g., laser light) and converts at least a portion of the incident radiation into heat to enable transfer of the microstructured layer from the thermal transfer element to the receptor. In some embodiments, there is no separate LTHC layer and, instead, the radiation absorber is disposed in another layer of the thermal transfer element, such as the donor substrate, the release layer, or the microstructured layer. In other embodiments, the thermal transfer element includes an LTHC layer and also includes additional radiation absorber(s) disposed in one or more of the other layers of the thermal transfer element, such as, for example, the donor substrate, the release layer, or the microstructured layer. In yet other embodiments, the thermal transfer element does not include an LTHC layer or radiation absorber and the microstructured layer is transferred using a heating element that contacts the thermal transfer element.

Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and preferably from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers can include carbon black, metal oxides, and metal sulfides. One example of a suitable LTHC layer can include a pigment, such as carbon black, and a binder, such as an organic polymer. Another suitable LTHC layer can include metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 µm or less, and may be about 1 µm or less. Suitable dyes include those dyes that absorb in the IR region of the spectrum. Examples of such dyes may be found in Matsuoka, M., "Infrared Absorbing Materials," Plenum Press, New York, 1990; Matsuoka, M., *Absorption Spectra of Dyes for Diode Lasers*, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,360,694; and 5,401,607; European Patent Nos. 321,923 and 568,993; and Beilo, K. A. et al., *J. Chem. Soc., Chem. Commun.*, 1993, 452–454 (1993), all of which are herein incorporated by reference. IR absorbers marketed by Glendale Protective Technologies, Inc., Lakeland, Fla., under the designation CYASORB IR-99, IR-126 and IR-165 may also be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc.

As indicated, a particulate radiation absorber may be disposed in a binder. The weight percent of the radiation absorber in the coating, excluding the solvent in the calculation of weight percent, is generally from 1 wt. % to 30 wt. %, preferably from 3 wt. % to 20 wt. %, and most preferably from 5 wt. % to 15 wt. %, depending on the particular radiation absorber(s) and binder(s) used in the LTHC.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been or can be polymerized or crosslinked. In some embodiments, the binder is primarily formed using a coating of crosslinkable monomers and/or oligomers with optional polymer. When a polymer is used in the binder, the binder includes 1 to 50 wt. %, preferably, 10 to 45 wt. %, polymer (excluding the solvent when calculating wt. %).

Upon coating on the donor substrate, the monomers, oligomers, and polymers are crosslinked to form the LTHC. In some instances, if crosslinking of the LTHC layer is too low, the LTHC layer may be damaged by the heat and/or permit the transfer of a portion of the LTHC layer to the receptor with the microstructured layer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook*, J. Brandrup, ed., pp. VII 519–557 (1989), incorporated herein by reference. In at least some embodiments, a thermoplastic resin that has a solubility parameter in the range of 9 to 13 $(cal/cm^3)^{1/2}$, preferably, 9.5 to 12 $(Cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 µm to 20 µm, preferably, 0.5 µm to 10 µm, and, most preferably, 1 µm to 7 µm. An inorganic LTHC layer is coated, in at least some instances, to a thickness in the range of 0.001 to 10 µm, and preferably, 0.002 to 1 µm.

Interlayer

Figure 3:
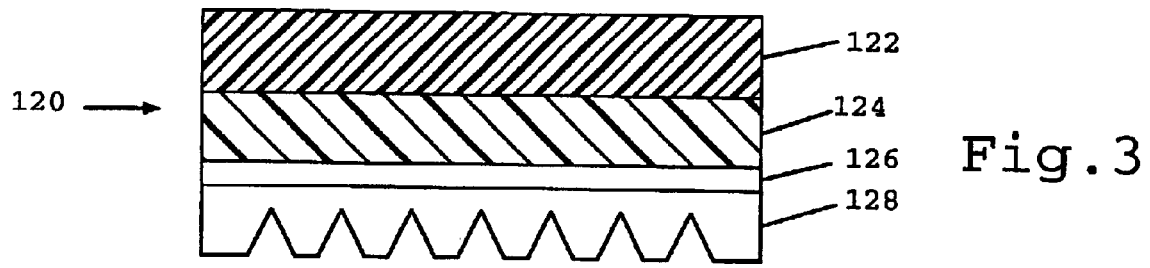
FIG. 3 is a cross-sectional view of a third embodiment of a thermal transfer element containing a microstructured layer, according to the invention.

An optional interlayer may be used in the thermal transfer element to minimize damage and contamination of the transferred portion of the transfer layer and may also reduce distortion in the transferred portion of the transfer layer. The interlayer may also influence the adhesion of the transfer layer to the rest of the thermal transfer element. FIG. 3 illustrates one embodiment of a thermal transfer element 120 including a donor substrate 122, a light-to-heat conversion layer 124, an interlayer 126, and a microstructured layer 128. Other thermal transfer elements including an interlayer can be formed. In some embodiments, the interlayer can be microstructured using, for example, a microstructuring tool so that a microstructured layer can be formed over the interlayer. The interlayer in this embodiment imposes microstructured features on the subsequently formed microstructured layer.

Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer unit (e.g., the microstructured layer and, optionally, the release layer).

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer unit so that thermally unstable materials can be transferred. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer typically is in the range of 0.05 μm to 10 μm, preferably, from about 0.1 μm to 4 μm, more preferably, 0.5 to 3 μm, and, most preferably, 0.8 to 2 μm. For inorganic interlayers (e.g., metal or metal compound interlayers), the thickness of the interlayer typically is in the range of 0.005 μm to 10 μm, preferably, from about 0.01 μm to 3 μm, and, more preferably, from about 0.02 to 1 μm.

Release Layer

Figure 4:
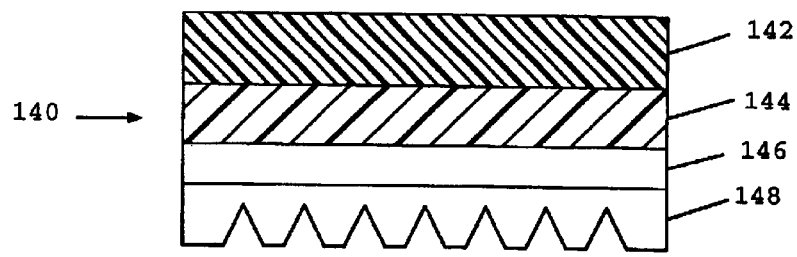
FIG. 4 is a cross-sectional view of a fourth embodiment of a thermal transfer element containing a microstructured layer, according to the invention.

The optional release layer typically facilitates release of the transfer unit (e.g., the microstructured layer) from the rest of the thermal transfer element (e.g., the interlayer and/or the LTHC layer) upon heating of the thermal transfer element, for example, by a light-emitting source or a heating element. In at least some cases, the release layer provides some adhesion of the transfer layer to the rest of the thermal transfer element prior to exposure to heat. FIG. 4 illustrates a thermal transfer element 140 including a donor substrate 142, a light-to-heat conversion layer 144, a release layer 146, and a microstructured layer 148. Other combinations of layers may also be used. In other embodiments, one of the other layers in the thermal transfer element may act as a release layer. For example, the first microstructured layer 166 of the thermal transfer element 160 illustrated in FIG. 5 can act as a release layer.

Suitable release layers include, for example, thermoplastic and thermoset polymers. Examples of suitable polymers include acrylic polymers, polyanilines, polythiophenes, poly(phenylenevinylenes), polyacetylenes, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, epoxy resins, and polycarbonates. Other suitable materials for the release layer include sublimable materials (such as phthalocyanines), including, for example, the materials described in U.S. Pat. No. 5,747,217, incorporated herein by reference.

The release layer can be part of the transfer unit (including the microstructured layer) or a separate layer that does not transfer. All or a portion of the release layer can be transferred with the transfer unit. Alternatively, most or substantially all of the release layer remains with the donor substrate when the transfer unit is transferred. In some instances, for example, with a release layer including sublimable material, a portion of the release layer is dissipated during the transfer process. In some embodiments, a portion of the release layer does transfer with the transfer unit and the release layer is formed of a material that can be removed by, for example, heating to sublimate, vaporize, liquefy, decompose, or depolymerize the transferred portion of the release layer.

Adhesion Layer

Figure 6:
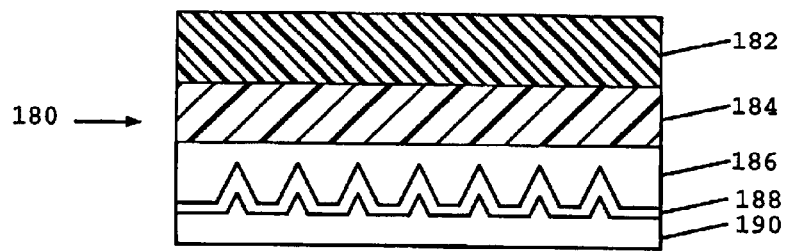
FIG. 6 is a cross-sectional view of a sixth embodiment of a thermal transfer element containing a microstructured layer, according to the invention.

The optional adhesion layer typically facilitates adhesion, to the receptor, of the portion of the transfer unit (e.g., the microstructured layer) that is to be transferred upon heating of the thermal transfer element, for example, by a light-emitting source or a heating element. FIG. 6 illustrates a thermal transfer element 180 including a donor substrate 182, a light-to-heat conversion layer 184, a release layer 186, a microstructured layer 188, and an adhesion layer 190. Other combinations of layers may also be used.

Suitable adhesion layers include, for example, thermoplastic and thermoset polymers. Examples of suitable polymers include acrylic polymers, polyanilines, polythiophenes, poly(phenylenevinylencs), polyacetylenes, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, epoxy resins, polyvinyl alcohol, polyvinyl pyrollidines, poly(methyl methacrylate), polycarbonates, and other crosslinkable resins. Other suitable materials for the release layer include sublimable materials (such as phthalocyanines), including, for example, the materials described in U.S. Pat. No. 5,747,217, incorporated herein by reference.

The adhesion layer is typically part of the transfer unit (including the microstructured layer). In some instances, for example, with the adhesion layer including sublimable material, a portion of the adhesion layer may be dissipated during the transfer process. In some embodiments, the adhesion layer is formed of a material that can be removed by, for example, heating to sublimate, vaporize, liquefy, decompose, or depolymerize the transferred portion of the adhesion layer.

Thermal Transfer

The thermal transfer element can be heated by application of directed heat on a selected portion of the thermal transfer element. Heat can be generated using a heating element (e.g., a resistive heating element), converting radiation (e.g., a beam of light) to heat, and/or applying an electrical current to a layer of the thermal transfer element to generate heat. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal transfer element, and the materials of the thermal transfer element.

For thermal transfer using radiation (e.g., light), a variety of radiation-emitting sources can be used in the present invention. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can be in the range from, for example, about 0.1 to 5 microseconds and laser fluences can be in the range from, for example, about 0.01 to about 1 J/cm$^2$.

When high spot placement accuracy is required (e.g. for high information, full color display applications) over large substrate areas, a laser is particularly useful as the radiation source. Laser sources are compatible with both large rigid substrates, such as 1 m×1 m×1.1 mm glass, and continuous or sheeted film substrates, such as 100 μm thick polyimide sheets.

Resistive thermal print heads or arrays may be used, for example, with simplified donor film constructions lacking a LTHC layer and radiation absorber. This may be particularly useful with smaller substrate sizes (e.g., less than approximately 30 cm in any dimension) or for larger patterns, such as those required for alphanumeric segmented displays.

During imaging, the thermal transfer element is typically brought into intimate contact with a receptor. In at least some instances, pressure or vacuum is used to hold the thermal transfer element in intimate contact with the receptor. A radiation source is then used to heat the LTHC layer (and/or other layer(s) containing radiation absorber) in an imagewise fashion (e.g., digitally or by analog exposure through a mask) to perform imagewise transfer of the transfer layer from the thermal transfer element to the receptor according to a pattern.

Alternatively, a heating element, such as a resistive heating element, may be used to transfer the transfer unit. The thermal transfer element is selectively contacted with the heating element to cause thermal transfer of a portion of the transfer layer according to a pattern. In another embodiment, the thermal transfer element may include a layer that can convert an electrical current applied to the layer into heat.

Figure 10A:
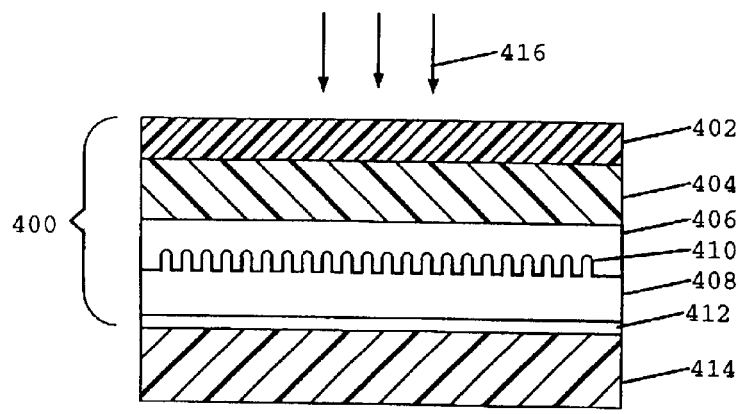
FIGS. 10A to 10C illustrate, in cross-sectional view, a method of transferring, to a receptor, a portion of a thermal transfer element containing a microstructured element, according to the invention.
Figure 10B:
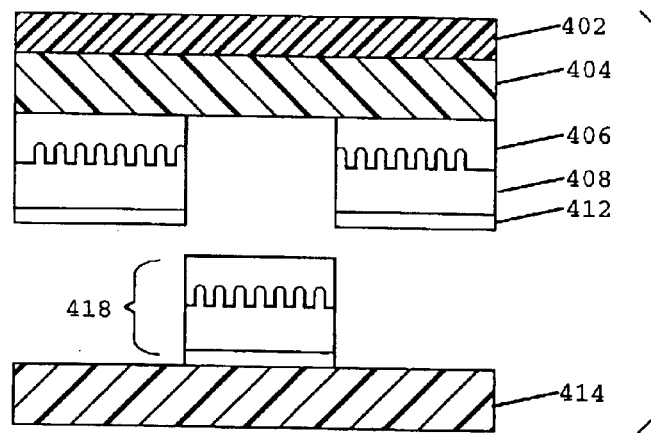
Figure 10C:
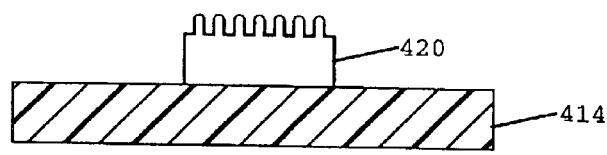

FIGS. 10A to 10C illustrate one method of transferring a portion of a microstructured layer 408 to a receptor 414. This method is illustrated using a thermal transfer element similar to that of FIG. 8, but it will be recognized that the method can be applied to other thermal transfer elements including those illustrated in the FIGS. 1–6. This particular thermal transfer element 400 includes a donor substrate 402, a light-to-heat conversion layer 404, a release layer 406, a microstructured layer 408 having a surface defining microstructured features 410, and an adhesion layer 412, as illustrated in FIG. 10A. The thermal transfer element 400 is brought into contact with the receptor 414 and the thermal transfer element is irradiated using light 416 according to a desired pattern. This effects the transfer of a portion 418 of the microstructured layer 408 and the adhesion layer 412 and optionally a portion of release layer 406 to the receptor, as illustrated in FIG. 10B. The remainder of the thermal transfer element is removed. Optionally, the transferred portions of the release layer 406 and/or adhesion layer 412 may be removed by, for example, heating to sublimate, vaporize, liquefy, decompose, depolymerize, or otherwise remove these layers, as illustrated in FIG. 10C. This leaves a transferred portion 420 of the microstructured layer.

Figure 11A:
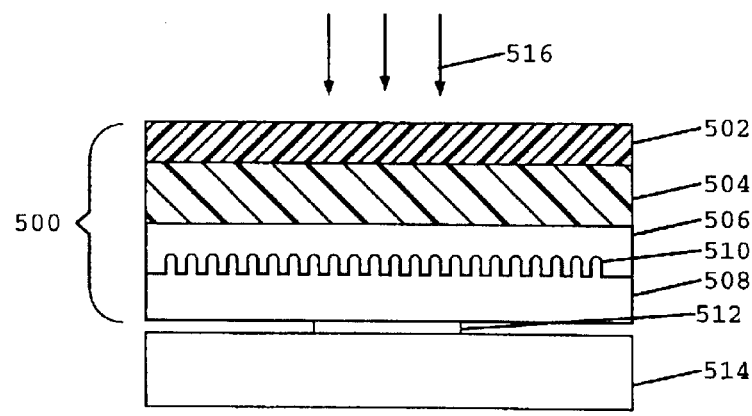
FIGS. 11A to 11C illustrate, in cross-sectional view, a second method of transferring, to a receptor, a portion of a thermal transfer element containing a microstructured element, according to the invention.
Figure 11B:
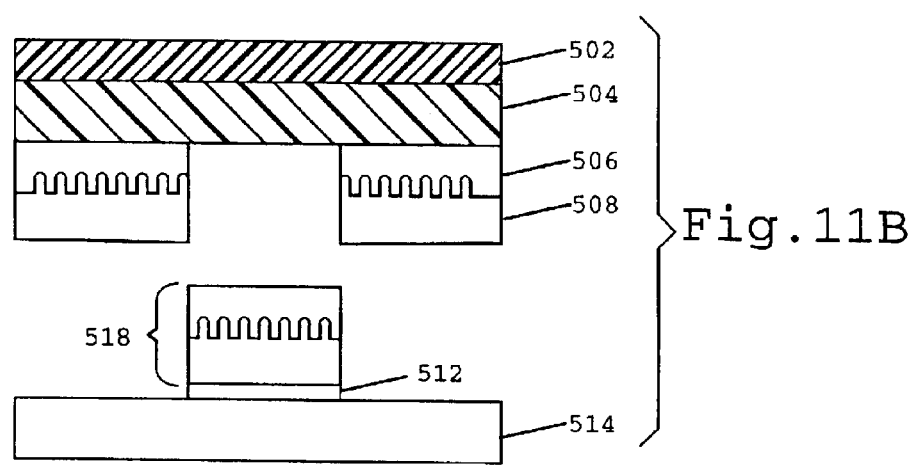
Figure 11C:
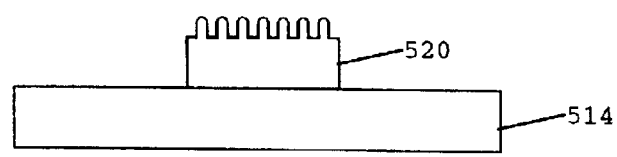

FIGS. 11A to 11C illustrate another method of transferring a portion of a microstructured layer 508 to a receptor 514. This method is illustrated using a thermal transfer element similar to that of FIG. 8, but it will be recognized that the method can be applied to other thermal transfer elements including those illustrated in the FIGS. 1–6. This particular thermal transfer element 500 includes a donor substrate 502, a light-to-heat conversion layer 504, a release layer 506, and a microstructured layer 508 having a surface defining microstructured features 510, as illustrated in FIG. 11A. The thermal transfer element 500 is brought into contact with the receptor 514. The receptor 514 has an adhesion layer 512 disposed thereon. This adhesion layer 512 may be formed in a pattern or may cover all or a substantial amount of the receptor 514. The adhesion layer 512 can be coated onto the receptor 514 using standard coating methods or the adhesion layer 512 can be formed on the receptor 514 using, for example, another thermal transfer element.

The thermal transfer element is irradiated using light 516 according to a desired pattern to effect the transfer of a portion 518 of the microstructured layer 508 and optionally a portion of release layer 506 to the receptor, as illustrated in FIG. 11B. The remainder of the thermal transfer element is removed. Optionally, the transferred portions of the release layer 506 and/or adhesion layer 512 may be removed by, for example, heating to sublimate, vaporize, liquefy, decompose, depolymerize, or otherwise remove these layers, as illustrated in FIG. 10C. This leaves a transferred portion 520 of the microstructured layer.

Typically, the transfer unit is transferred to the receptor without transferring other layers of the thermal transfer element, such as the optional interlayer and the LTHC layer. The presence of the optional interlayer may eliminate or reduce the transfer of the LTHC layer to the receptor and/or reduce distortion in the transferred portion of the transfer layer. Preferably, under imaging conditions, adhesion of the interlayer to the LTHC layer is greater than adhesion of the interlayer to the transfer layer. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

During laser exposure, it may be desirable to minimize formation of interference patterns due to multiple reflections from the imaged material. This can be accomplished by various methods. The most common method is to effectively roughen the surface of the thermal transfer element on the scale of the incident radiation as described in U.S. Pat. No. 5,089,372. This has the effect of disrupting the spatial coherence of the incident radiation, thus minimizing self interference. An alternate method is to employ an antireflection coating within the thermal transfer element. The use of anti-reflection coatings is known, and may consist of quarter-wave thicknesses of a coating such as magnesium fluoride, as described in U.S. Pat. No. 5,171,650, incorporated herein by reference.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element moved beneath the laser.

In some instances, it may be necessary, desirable, and/or convenient to sequentially use two or more different thermal transfer elements to form a device or structure. Each of these thermal transfer elements includes a transfer unit to transfer one or more layers to the receptor. The two or more thermal transfer units are then sequentially used to deposit one or more layers of the device.

EXAMPLES

Unless otherwise indicated, chemicals were obtained from Aldrich Chemical Company (Milwaukee, Wis.).

Example 1

Preparation of a Substrate/LTHC/Interlayer Element

A carbon black light-to-heat conversion layer was prepared by coating the following LTHC Coating Solution, according to Table 1, onto a 0.1 mm PET substrate with a Yasui Seiki Lab Coater, Model CAG-150 (Yasui Seiki Co., Bloomington, Ind.) using a microgravure roll of 381 helical cells per lineal cm (150 helical cells per lineal inch).

TABLE 1

LTHC Coating Solution

| Component | Parts by Weight |
|---|---|
| Raven ™ 760 Ultra carbon black pigment (available from Columbian Chemicals, Atlanta, GA) | 3.39 |
| Butvar ™ B-98 (polyvinylbutyral resin, available from Monsanto, St. Louis, MO) | 0.61 |
| Joncryl ™ 67 (acrylic resin, available from S.C. Johnson & Son, Racine, WI) | 1.81 |
| Elvacite ™ 2669 (acrylic resin, available from ICI Acrylics, Wilmington, DE) | 9.42 |
| Disperbyk ™ 161 (dispersing aid, available from Byk Chemie, Wallingford, CT) | 0.3 |
| FC-430 ™ (fluorochemical surfactant, available from 3 M, St. Paul, MN) | 0.012 |
| Ebecryl ™ 629 (epoxy novolac acrylate, available from UCB Radcure, N. Augusta, SC) | 14.13 |
| Iragure ™ 369 (photocuring agent, available from Ciba Specialty Chemicals, Tarrytown, NY) | 0.95 |
| Irgacure ™ 184 (photocuring agent, available from Ciba Specialty Chemicals, Tarrytown, NY) | 0.14 |
| Propylene glycol methyl ether acetate | 16.78 |
| 1-methoxy-2-propanol | 9.8 |
| Methyl ethyl ketone | 42.66 |

The coating was in-line dried at 40° C. and UV-cured at 6.1 m/min using a Fusion Systems Model I600 (400 W/in) UV curing system fitted with H-bulbs. The dried coating had a thickness of approximately 3 microns.

Onto the carbon black coating of the light-to-heat conversion layer was rotogravure coated an Interlayer Coating Solution, according to Table 2, using the Yasui Seiki Lab Coater, Model CAG-150 (Yasui Seiki Co., Bloomington, Ind.). This coating was in-line dried (40° C.) and UV-cured at 6.1 m/min using a Fusion Systems Model 1600 (600 W/in) fitted with H-bulbs. The thickness of the resulting interlayer coating was approximately 1.7 microns.

TABLE 2

Interlayer Coating Solution

| Component | Parts by Weight |
|---|---|
| Butvar ™ B-98 | 0.98 |
| Joncryl ™ 67 | 2.95 |
| Sartomer ™ SR351 ™ (trimethylolpropane triacrylate, available from Sartomer, Exton, PA) | 15.75 |
| Irgacure ™ 369 | 1.38 |
| Irgacure ™ 184 | 0.2 |
| 1-methoxy-2-propanol | 31.5 |
| Methyl ethyl ketone | 47.24 |

Example 2

Preparation of a Nanostructured Film

A nanostructured film was prepared as described in U.S. Pat. Nos. 5,039,561 and 5,726,524. About 1500 Angstroms of an organic red pigment (N,N'-di(3,5-xylyl)perylene-3,4, 9,10 bis(dicarboxamide), commercially available under the trade designation "C.I. Pigment Red 149" from American Hoechst Corp., Somerset, N.J.) was vacuum coated onto a one square foot (about 0.09 m$^2$) sheet of metallized polyimide (Upilex-5, UBE Industries, Ltd., Tokyo, Japan). The sheet was annealed in a vacuum of 10$^{-3}$ torr to convert the film to an array of discretely oriented crystalline nanostructured features. The number density of these features was about 30 to 40 per square micrometer. The height of the features averaged about 1.5 $\mu$m with an average cross-sectional dimension of about 0.05 $\mu$m or less. These nanostructured features were then conformally overcoated with 4400 Angstroms of platinum by vapor deposition.

Example 3

Preparation of a Thermal Transfer Element

The substrate/LTHC/interlayer element of Example 1 was coated with a thermoplastic release layer of an acrylic polymer (Elvacite 2776, ICI Acrylics, St. Louis, Mo.). The acrylic polymer was applied using a 10 wt. % aqueous solution of the polymer and a #6 Mayer bar to a thickness of about one micrometer. The polymer was then dried.

The nanostructured features of the nanostructured film of Example 2 were embedded into the thermoplastic release layer. To embed the nanostructured features, the nanostructured film was brought into contact with the thermoplastic release layer and placed between heated (75° C.) platens of a Carver press and a pressured of 15–20 metric tons per 25 cm$^2$ was applied for about one minute. The assembly was cooled under pressure.

After removal from the Carver press, the metallized polyimide backing of the nanostructured film was peeled away leaving the nanostructured features embedded in the thermoplastic layer. The nanostructured layer was then coated with about 0.5 μm of Elvacite 2776 using a 5 wt. % aqueous solution of the polymer and a #6 Mayer bar to form an adhesion layer. This polymer was then allowed to dry.

Example 4

Thermal Transfer of a Nanostructured Layer

The thermal transfer element of Example 3 was then used to transfer a portion of the nanostructured layer onto a glass receptor. The laser transfer system included a CW Nd:YAG laser, acousto-optic modulator, collimating and beam expanding optics, an optical isolator, a linear galvonometer and an f-theta scan lens. The Nd:YAG laser was operating in the TEM 00 mode, and produced a total power of 8.5 Watts. Scanning was accomplished with a high precision linear galvanometer (Cambridge Technology Inc., Cambridge, Mass.). The laser was focused to a Gaussian spot with a measured size of 140 μm by 150 μm at the $1/e^2$ intensity level. The spot was held constant across the scan width by utilizing an f-theta scan lens. The laser spot was scanned across the image surface at a velocity of 5.28 meters/second. The result was a uniform transfer of 110 μm lines containing the adhesion layer, the nanostructured layer, and the release layer.

The receptor and transferred lines were baked in a nitrogen atmosphere at 400° C. with a half hour temperature ramp up and a minimum half hour temperature hold to remove the transferred adhesion and release layers. Scanning electron microscope studies of the resulting transferred nanostructured layer showed that the nanostructured features had been transferred while preserving their orientation, spatial distribution, and physical properties.

Example 5

Thermal Transfer of a Microstructured Layer

A first thermal transfer element was made by coating a 7.5 μm thick solution of Elvacite™ 2776 (acrylic resin, available from ICI Acrylics, Wilmington, Del.) onto a Substrate/LTHC/Interlayer Element formed according to Example 1 to form a transfer layer. The solution was dried at 80° C. for about 3 minutes. The dried solution was embossed with a microstructured embossing tool. The microstructured embossing tool was diamond machined from a solid piece of metal using a square pattern of horizontal and vertical grooves of variable pitch. The overall pattern on the tool was that of a grid with each square grid section having a different uniform vertical and horizontal pitch. The diamond used to cut the pattern had an included angle of 30 degrees and a tip width of 5.5 microns. All patterns were cut with a nominal depth of 5.6 microns. The pitch of the pattern in the horizontal and vertical directions ranged from 11.8 to 27 microns. After embossing, 100 Angstroms of aluminum was vapor coated onto the embossed surface of the transfer layer.

A second thermal transfer element was made by coating a 2.5 μm thick solution of 98 wt. % Elvacite™ 2776 (acrylic resin, available from ICI Acrylics, Wilmington, Del.) and 2 wt. % Heloxy™ 67 (Shell Chemical Co., Houston, Tex.) onto a Substrate/LTHC/Interlayer Element formed according to Example 1 to form a transfer layer. The solution was dried at 80° C. for about 3 minutes.

The second thermal transfer element was then used to transfer an adhesion layer onto a soda limed glass substrate. The transfer system included a CW Nd:YAG laser, acousto-optic modulator, collimating and beam expanding optics, an optical isolator, a linear galvonometer and an f-theta scan lens. The Nd:YAG laser was operating in the TEM 00 mode, and produced a total power of 16 Watts. Scanning was accomplished with a high precision linear galvanometer (Cambridge Technology Inc., Cambridge, Mass.). The laser was focused to a Gaussian spot with a measured size of 140 μm by 150 μm at the $1/e^2$ intensity level. The spot was held constant across the scan width by utilizing an f-theta scan lens. The laser spot was scanned across the image surface at a velocity of 6.95 meters/second. The result was a uniform transfer of 86 μm lines containing the Elvacite layer to the glass substrate.

The first thermal transfer element was then used to transfer the microstructured layer, in registration and coincident, onto the adhesion layer formed using the second thermal transfer element. The transfer system included a CW Nd:YAG laser, acousto-optic modulator, collimating and beam expanding optics, an optical isolator, a linear galvonometer and an f-theta scan lens. The Nd:YAG laser was operating in the TEM 00 mode, and produced a total power of 16 Watts. Scanning was accomplished with a high precision linear galvanometer (Cambridge Technology Inc., Cambridge, Mass.). The laser was focused to a Gaussian spot with a measured size of 140 μm by 150 μm at the $1/e^2$ intensity level. The spot was held constant across the scan width by utilizing an f-theta scan lens. The laser spot was scanned across the image surface at a velocity of 6.15 meters/second. The result was a uniform transfer of 56 μm lines containing the microstructured layer to the glass substrate on the Elvacite™ layer from the first thermal transfer element. The resulting structure on the glass substrate was baked in nitrogen at 150° C. for 1.5 hours. Prior to and after baking, the transferred microstructured layer retained the microstructured features.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A method of making a thermal transfer element, the method comprising steps of:
   providing a substrate;
   forming a microstructured layer having a non-planar surface defining a plurality of microstructured features imposed on the microstructured layer, wherein the microstructured layer and the substrate are disposed relative to each other to permit selective transfer of at least a portion of the microstructured layer to a receptor while substantially preserving the microstructured features of the portion.

2. The method of claim 1, further comprising forming a light-to-heat conversion layer between the substrate and the microstructured layer.

3. The method of claim 2, further comprising forming a release layer between the light-to-heat conversion layer and the microstructured layer.

4. The method of claim 3, further comprising forming microstructured features in the release layer.

5. The method of claim 4, wherein the step of forming the microstructured layer comprises disposing a layer on the release layer having the microstructured features to generate the microstructured layer adjacent the release layer.

6. The method of claim 3, wherein the step of forming the microstructured layer comprises embedding microstructured features into the release layer.

7. The method of claim 1, further comprising disposing an adhesion layer on the microstructured layer to facilitate transfer of the portion of the microstructured layer to the receptor.

8. A thermal transfer element, comprising:

a substrate; and a microstructured layer having a non-planar first surface defining microstructured features imposed on the microstructured layer and a second surface opposite the first surface, the first surface facing toward the substrate and the second surface facing away from the substrate;

wherein the thermal transfer element is configured and arranged for transfer of at least a portion of the microstructured layer to a receptor while substantially preserving the microstructured features of that portion.

9. The thermal transfer element of claim 8, wherein the non-planar first surface of the microstructured layer defines nanostructured features imposed on the microstructured layer, wherein the thermal transfer element is configured and arranged for transfer of at least a portion of the microstructured layer to a receptor while substantially preserving the nanostructured features of that portion.

10. The thermal transfer element of claim 8, wherein the non-planar first surface comprises a plurality of first microstructured features and a plurality of second microstructured features disposed on the first microstructured features.

11. The thermal transfer element of claim 8, wherein the microstructured layer defines a plurality of microstructured features that are capable of use as electron emitters when coupled to a power source.

12. The thermal transfer element of claim 8, further comprising a release layer to facilitate release of the portion of the microstructured layer from the substrate.

13. The thermal transfer element of claim 8, further comprising a multilayer transfer unit that includes the microstructured layer, wherein the thermal transfer element is configured and arranged for transfer of at least a portion of the multilayer transfer unit to a receptor.

14. The thermal transfer element of claim 13, wherein the multilayer transfer unit further includes a release layer.

15. The thermal transfer element of claim 14, wherein the release layer has a surface defining microstructured features.

16. The thermal transfer element of claim 8, wherein the microstructured layer is disposed adjacent the release layer and the non-planar first surface of the microstructured layer defines microstructured features that correspond to the microstructured features of the release layer.

17. The thermal transfer element of claim 8, further comprising an adhesion layer to facilitate adhesion of the portion of the microstructured layer to the receptor during transfer.

18. The thermal transfer element of claim 8, further comprising a light-to-heat conversion layer disposed between the substrate and the microstructured layer.

19. The thermal transfer element of claim 18, further comprising an interlayer disposed between the light-to-heat conversion layer and the microstructured layer.

20. The thermal transfer element of claim 19, wherein the interlayer has a surface defining mirostructured features imposed on the interlayer.

21. The thermal transfer element of claim 8, wherein the thermal transfer element comprises a plurality of microstructured layers, each microstructured layer having a non-planar first surface defining microstructured features imposed on the microstructured layer and a second surface opposite the first surface, each first surface facing toward the substrate and each second surface facing away from the substrate.

22. The thermal transfer element of claim 8, wherein the microstructured features are formed from a thermoplastic polymer, a thermoset polymer, or an organometallic compound.

23. The thermal transfer element of claim 8, wherein the microstructured features are formed from a material selected from the group consisting of carbon, diamond-like carbon, metal oxides, non-metal oxides, metal carbides, non-metal carbides, metal borides, non-metal borides, metal sulfide, non-metal sulfide, metal silicides, metals, and semiconductor materials.

24. The article of claim 8, further comprising a layer of material on the microstructured features.

25. The article of claim 24, wherein the layer of material provides electrical conductivity.

26. The article of claim 25, wherein the layer of material comprises a conductive polymer.

27. The article of claim 24, wherein the non-planar first surface of the microstructured layer defines nanostructured features imposed on the microstructured layer.

28. The article of claim 27, wherein the nanostructured features have a cylindrical shape.

29. An article, comprising:

a substrate; and a microstructured component having a non-planar surface defining microstructured features imposed on the microstructured layer, the surface facing toward the substrate;

wherein the microstructured component is formed on the substrate by thermal transfer of at least a portion of a microstructured layer from a thermal transfer element comprising the microstructured layer.

30. The article of claim 29, wherein the microstructured features defined by the surface of the microstructured component form a plurality of electron emitters.

31. The article of claim 29, wherein the microstructured features defined by the surface of the microstructured component form an electronic component.

32. The article of claim 31, wherein the electronic component is a microelectrode, an electroluminescence device, a field emission cathode, a semiconductor, an optical, or a microelectrical mechanical device.

* * * * *

UNITED STATES PATENT AND TRADEMARK OFFICE
CERTIFICATE OF CORRECTION

PATENT NO.   : 6,770,337 B2
DATED        : August 3, 2004
INVENTOR(S)  : Debe, Mark K.

It is certified that error appears in the above-identified patent and that said Letters Patent is hereby corrected as shown below:

Column 14,
Line 42, delete "phenylenevinylencs" and insert therefore -- phenylenevinylenes --.

Column 17,
Line 57, delete "Iragure" and insert -- Iragacure --.

Column 22,
Line 5, delete "mirostructured" and insert therefore -- microstructured --.
Lines 22 and 23, delete "sulfide" and insert therefore -- sulfides --.

Signed and Sealed this

First Day of February, 2005

JON W. DUDAS
*Director of the United States Patent and Trademark Office*